(12) United States Patent
Lowe et al.

(10) Patent No.: US 6,315,873 B1
(45) Date of Patent: Nov. 13, 2001

(54) METHOD OF FORMING A FLUORIDE FILM

(76) Inventors: Gregory Kent Lowe, 8147 Midnight Way, Tucson, AZ (US) 85741; Donald Bennett Hilliard, 3050 N. Fontana, Tucson, AZ (US) 85705

( * ) Notice: Subject to any disclaimer, the term of this patent is extended or adjusted under 35 U.S.C. 154(b) by 0 days.

(21) Appl. No.: 09/579,654

(22) Filed: May 26, 2000

Related U.S. Application Data

(60) Provisional application No. 60/136,296, filed on May 27, 1999.

(51) Int. Cl.$^7$ .................................................. C23C 14/34
(52) U.S. Cl. .............................. 204/192.15; 204/192.16; 204/192.22; 204/192.26; 204/192.11
(58) Field of Search ........................ 204/192.12, 192.15, 204/192.16, 192.27, 192.21, 192.22, 192.23, 192.25, 192.26, 192.11

(56) References Cited

U.S. PATENT DOCUMENTS 4,992,839 * 2/1991 Shirai ................................. 357/23.7

FOREIGN PATENT DOCUMENTS 2-289495 * 11/1990 (JP) .
56-98475 * 8/1981 (JP) ................................. 204/192.2

OTHER PUBLICATIONS

L. Martinu, et al. Thin Films Prepared by Sputtering MgF$_2$ in an rF Planar Magnetron. Vacuum. Dec. 1985; p 531–5. vol. 35 n12, Pergamon Press. Great Britain.

J.G. Cook, et al. RF Magnetron Deposition of Calcium Fluoride. Thin Solid Films. Sep. 1992; p 87–90 vol. 217 n1–2.

N. Marechal, et al. Radio Frequency Sputter Deposition and Properties of Calcium Fluoride Films. J. Appl. Phys. Oct. 15, 1993; p 5203–11. vol. 74 n8 APS Press. USA.

N.J. Dudney. Radio Frequency Magnetron Sputter Deposition of CaF$_2$ Films. JVST. Mar.–Apr. 1998; p 615–23 vol. 16 n2 APS Press. USA.

K. Kawamata. KMS. (Keep Molecule Sputtering) Deposition of Optical MgF$_2$ Thin Films. Vacuum. Dec. 1998; p 559–64 vol. 51 n4. Pergamon Press, Great Britain.

* cited by examiner

*Primary Examiner*—Rodney G. McDonald

(57) ABSTRACT

A method for depositing films of a fluorinated compound is disclosed, wherein a reactive sputtering process allows the use of a metal or other non-fluorinated material as the target material. The process developed also utilizes XeF$_2$ as a vapor source, which provides fluorine for the formation of the fluorinated compound. Unlike reactive process gases, such as SF$_4$ and CF$_4$, used in previous experiments attempting reactive sputtering of fluoride compounds, the XeF$_2$ vapor does not result in unwanted contamination due to a reactive gas cation, i.e., inclusions of carbon or sulfur. These, and other considerations, have allowed the development of a process for fabricating dense, optical quality fluoride films. At the same time, the material costs and handling expenses related to the XeF$_2$ source are also relatively low. The method described is ideally suited for the deposition of metal fluoride compounds for use in anti-reflection coatings, UV optical coatings, as well as various applications in the semiconductor, optoelectronics, and other industries.

4 Claims, 1 Drawing Sheet

METHOD OF FORMING A FLUORIDE FILM

RELATED APPLICATIONS

This application is related to U.S. Provisional Patent Application No. 60/136,296 filed May 27, 1999.

FIELD OF THE INVENTION

The present invention concerns the formation of thin or thick films containing fluorinated compounds and, more particularly, a sputter vapor deposition process that produces such films to possess highly desirable properties. The process of the present invention is seen to have application in various fields of industry, such as in the semiconductor and optical fields where fluorinated compounds are utilized; for example, in anti-reflection coatings, UV-transmitting optics, corrosion-resistant coatings, electro-optics, and lithography masks.

DESCRIPTION OF THE RELATED ART

The vacuum deposition of fluoride films in research and industry is predominantly achieved via vacuum evaporation techniques; namely through the use of boat and e-beam systems which thermally transfer material to the substrate from a source material of roughly the same composition. This method of depositing fluorides, while adequate for many applications, has many of the same drawbacks associated with evaporative vacuum deposition in general. Such drawbacks including high heat transfer to the substrate, poor adhesion without additional processing, low-density films without unduly high substrate temperatures, and difficulty in achieving the desired stoichiometry.

Such drawbacks might be addressed through application of the more energetic sputtering deposition techniques. The term "sputtering" refers to a group of mechanisms by which material is ejected from a solid, or sometimes a liquid, target surface into a vapor form. This latter effect is due, at least in part, in either physical or chemical sputtering, to the kinetic energy transferred to the target atoms or molecules by bombarding particles. Because the particles generated in sputtering processes tend to be more activated—kinetically and chemically—than in the case of evaporation processes, the resultant condensed films tend to be relatively dense, well-adhering, and stoichiometric. These mechanisms are utilized in sputter deposition processes categorized generally as laser sputtering, ion beam sputtering, and plasma (or glow discharge) sputtering. Plasma sputtering, which is utilized in the preferred embodiment of the present invention, refers to a wide variety of sources including the earlier diode sputtering, magnetron sputtering, helical plasma sputtering, electron cyclotron resonance (ECR) sputtering, and so forth.

A number of attempts have been made to develop a successful sputtering process for depositing fluoride films. In most of these previous studies, a sputtering target comprising the desired fluoride material is sputtered with a radio frequency (r.f.) discharge in an inert process gas, such as argon. Earlier attempts to deposit metal fluoride (namely $MgF_2$) films experienced many difficulties. The more persistent of such difficulties include fluorine-deficiency in the deposited films, lack of a specular, optical-quality microstructure in the deposited film, and the inability to supply a reasonable power density to the sputtering plasma without fracturing the fluoride target, due to thermal shock. Various attempts have been made to address these difficulties. Martinu[1], et al, used a fluorinated process gas, consisting of $CF_4+Ar+O_2$, to increase fluorine adsorption; in this case, oxygen was introduced to prevent incorporation of carbon in the deposited film. The films deposited in this latter experiment were nonetheless found to be fluorine-deficient, as well as to contain oxygen impurities. In subsequent years, researchers experimented with other fluorinated gas combinations with an aim to simultaneously achieve optical quality microstructures and the desired fluorine content[2,3]. These later efforts have included use of such fluorinated process gases as $CF_4$, $SF_6$, and $NF_3$. However, in all such cases, the problem of fluorine deficiency has persisted, along with the—perhaps, related—problem of poor film microstructure. In recent years, instances of greater success have been reported in sputter depositing fluoride films. In these recent cases, fluorinated gases were not used. Instead, more radical equipment designs have been applied. For example, Dudney[4] utilized facing-target and off-axis sputtering, with Ar and Ne process gas, to achieve significant improvements in film stoichiometry. Kawamata[5], et al, utilized an oxygen background and a heated target, purportedly to maintain the sputtered vapor in a molecular state. While these latest efforts are deemed the most successful to date, it is not yet evident whether such fluoride sputtering processes are ready for commercial applications in optical-quality coatings.

SUMMARY OF THE INVENTION

The present invention addresses the previously cited problems in forming films of fluoride compounds, in part, through the utilization of the novel compound, xenon difluoride ($XeF_2$). While $XeF_2$ has been used successfully in etching systems, its highly oxidizing properties require careful manipulation for reliable thin film deposition. The present invention provides, in its first preferred embodiment, a highly safe and repeatable means of depositing optical-quality fluoride thin films by reactive magnetron sputtering. This latter condition is best found through the use of "metallic mode" sputtering and careful control of separate gas flows, so that the unique chemistry of $XeF_2$ may be selectively applied.

One object of the present invention is to provide a method of sputter depositing thin films of stoichiometric fluorinated compounds of sufficiently low porosity, low optical absorption, and featureless surface morphology, as to be compatible with the requirements of optical applications.

Another object of the present invention is to provide a means of depositing dense fluoride compounds at low process temperatures compatible with plastics and other heat sensitive substrates.

Yet another object of the present invention is to sputter deposit fluorinated compounds while substantially avoiding contamination due to inclusions of process gas precursors.

Another object of the present invention is to provide a relatively inexpensive process for forming films of fluorinated compounds in a high deposition rate sputtering process.

Another object of the invention is to develop a method of forming a fluoride film that allows minimization of the thermal shock and mechanical stress induced in the film or substrate.

Other objects, advantages and novel features of the invention will become apparent from the following description thereof.

DESCRIPTION OF THE PREFERRED EMBODIMENTS

Figure 1:
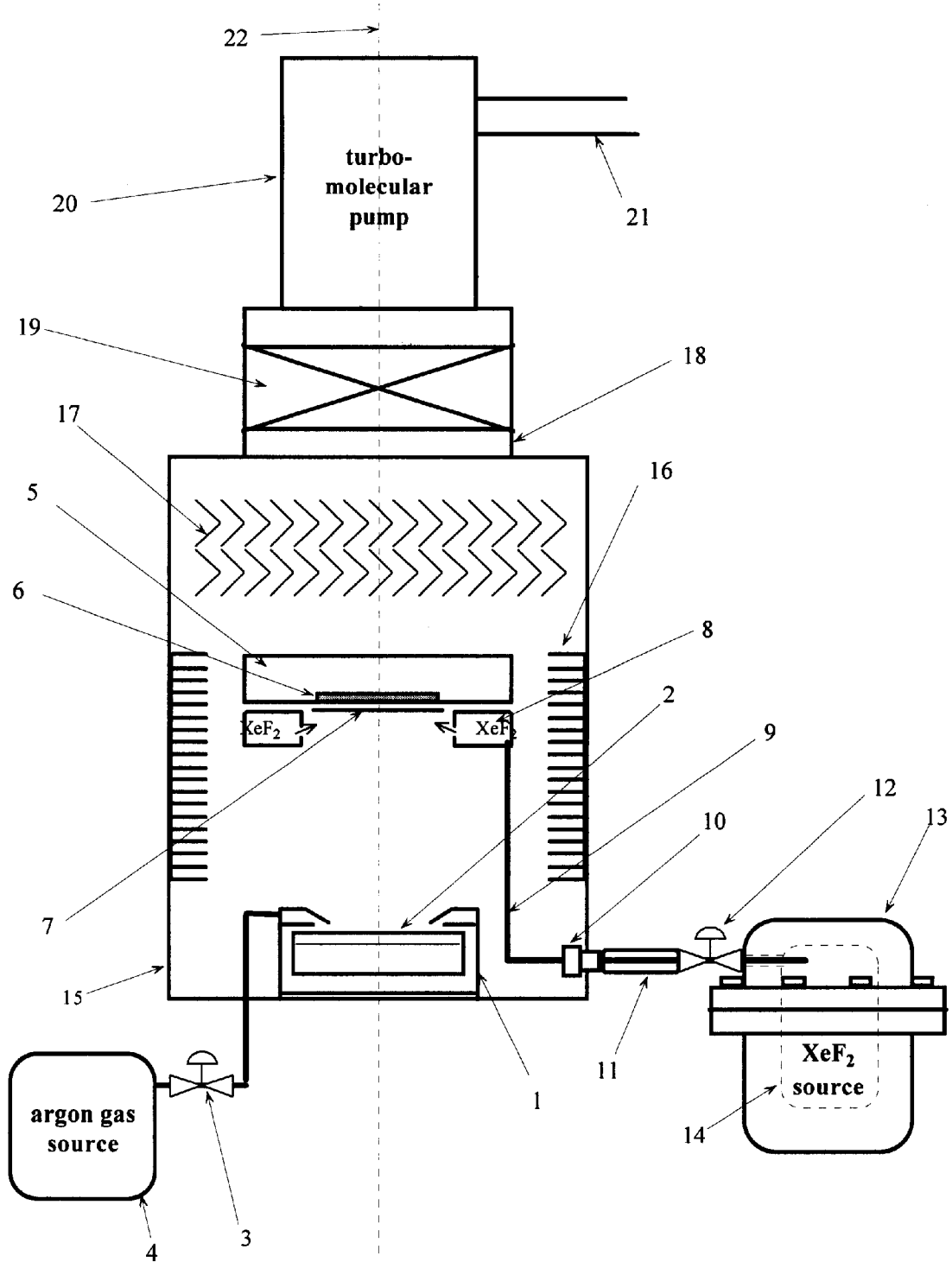
FIG. 1 is a sectional side view of the vapor deposition chamber, displaying various embodiments of the present invention.

The following description and FIG. 1 of the drawings depict a preferred embodiment of the present invention. The embodiments set forth herein are provided to convey the scope of the invention to those skilled in the art. While the invention will be described in conjunction with the preferred embodiments, various alternative embodiments to the structures and methods illustrated herein may be employed without departing from the principles of the invention described herein.

In FIG. 1 is a sectional view of the reactive sputtering vapor deposition chamber used, in the present invention, for depositing a metal-fluoride thin film. The dashed vertical line (22) indicates the axis of rotational symmetry for components of the drawing which are symmetrical about this axis. Many of the system components and practices used in conjunction with the embodiments of FIG. 1 will not be discussed herein, as they are familiar to those skilled in the art, and do not help clarify the embodiments of the present invention. The vapor deposition chamber of FIG. 1 is designed so as to permit only halogen-compatible chamber materials to be exposed to the $XeF_2$ vapor. As such, the chamber and its internal parts are constructed predominantly from aluminum, copper, and such perfluorinated polymers as Teflon or Chemraz. As such, the chamber is economically constructed out of aluminum, which, like copper, develops a passivated metal-halide surface on exposure to halogen vapor. The substrate holder/heater (5) is constructed predominantly from copper, with Chemraz-insulated electrical connections; while this is found adequate for substrate temperatures up to 250° C., many designs exist in the semiconductor industry prior art for achieving higher process temperatures in halogen-related processes.

The sputter source (1), in FIG. 1, is a planar magnetron plasma sputter source, utilized in the preferred embodiment for its ability, over other sputter source configurations, to efficiently deliver high deposition rates with relatively long target-substrate separation distances. This long throw distance, enabled by the magnetron's ability to efficiently operate at relatively low pressures, allows the target (2) to be sputtered by so-called "metallic-mode sputtering", whereby the target surface remains metallic rather than developing an insulating surface layer due to reaction with a process gas. This latter condition is achieved by admitting the reactive process gas at the substrate via a gas manifold (8) adjacent the substrate (6), as well as by maintaining a steady flow of the inert sputter gas—such as argon—at the sputtering target. This is accomplished, in the embodiments of FIG. 1, by injecting argon underneath the sputter shield of the magnetron sputter source (1) in FIG. 1. The argon is supplied via an appropriate gas metering device (3), such as an in-series stainless steel bellows metering valve and mass flow meter. The argon source (4) is of at least 99.999% purity. As a result of this "metallic mode" sputtering approach, it is found that the atoms are sputtered from the target surface and transported through the vacuum as a predominantly metallic vapor.

This metallic vapor is then condensed on the substrate (6), where the locally injected $XeF_2$ vapor may then react with the condensed metal to form the desired metal fluoride compound. In the case of depositing magnesium fluoride, the reaction would proceed thus,

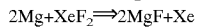

$$2Mg + XeF_2 \Rightarrow 2MgF + Xe$$

The reactive gas manifold (8) encompasses the substrate region, with inwardly directed injection ports designed to efficiently direct the $XeF_2$ vapor onto the substrate surface. This reactive gas manifold is constructed of Teflon ®, as is its supply line. The Teflon supply tubing (9), which provides $XeF_2$ to the reactive gas manifold, passes through a bored Cajon ®-style compression O-ring feed-through (10), which passes through the chamber wall. On the atmosphere side of the chamber wall, the Teflon $XeF_2$ supply tube is encapsulated in a stainless steel bellows line (11) filled with argon, allowing an argon back-fill gas to surround the Teflon supply tube en route to a Teflon metering valve (12) and $XeF_2$ source canister (13). This inert gas shield prevents exposure of the Teflon line to air, preventing atmospheric hydrogen from diffusing through the Teflon tube, where it would combine with the $XeF_2$ to form unwanted hydrofluoric acid vapor. The $XeF_2$ source canister is essentially a constant-temperature sublimation source, with a stainless steel outer shell providing an argon jacket around the Teflon container (14) which houses the solid $XeF_2$ source material.

While halogen gases are frequently dealt with in the semiconductor industry through the use of expensive pumping equipment and maintenance schedules, much of the expense of handling halide gases is alleviated in the present invention. In the preferred embodiments of the invention, the halogen gas load on the vacuum pumps and exhaust systems is substantially reduced through effective trapping of the fluorine gas within the process chamber; this latter effect is derived through the getter-sputtering mechanisms enabled by sputtering a metallic target. If, for example, magnesium fluoride is the material to be deposited at the substrate, the magnesium metal vapor sputtered from the magnesium target will condense on the substrate as well as chamber baffles (16). These latter baffles are constructed of aluminum. In the preferred embodiment of the invention, the flow rate of $XeF_2$ is maintained at a level only sufficient to produce the desired stoichiometric fluoride compound on the substrate; the substrate and resulting metal fluoride deposit being the article of manufacture. The sputtered metal vapor arriving elsewhere in the chamber, such as on the baffles (16), will be more than sufficient to getter and passivate the majority of remaining fluoride vapor. Reactive metals such as magnesium, once condensed, will efficiently reduce any impinging $XeF_2$ molecules in the same type of reaction occurring at the substrate. Hence, the amount of $XeF_2$ vapor loading the pumping and exhaust system will be considerably reduced. Any trace fluorine may be gettered by an aluminum mesh trap (17) installed in front of the throttle valve (18). The chamber (15), baffles (16), and fluorine trap (17) all receive a bake-out, under high argon flow, at a pressure of around 100 mTorr, prior to admitting $XeF_2$ into the process chamber. This latter bake-out (~200° C.) is necessary to remove any residual adsorbed $H_2O$ from the process chamber, as water will react with the $XeF_2$ to form undesirable species, namely, oxygen and HF. Of course, the chamber baffles and fluorine trap must be periodically replaced. In its preferred embodiment, the present invention utilizes a corrosive-duty turbo-molecular drag pump (20) to achieve high flow rates with reliable and safe operation. As is standard in the art of vacuum deposition, a mechanical pump may both rough the chamber and back the turbo-molecular pump via the foreline connection (21). The mechanical pump is equipped with corrosive-duty oil, such as Fomblin ®, for dependable performance.

While the previous discussion indicates the simplified system design requirements for depositing fluoride compounds in the present invention, the primary advantages of the preferred embodiments concern the properties of the fluorinated compounds deposited on the substrate. Using the methods and apparatus of the present invention, dense, specular, and optically transparent films of fluorinated compounds, such as group I and group II metal fluorides, can be achieved in a reactive sputtering process. These resulting films can be achieved, in the present invention, at substrate temperatures of less than 100° C., allowing the deposition of fluoride materials on many plastics and other organic materials.

The procedure for depositing high quality fluoride compounds will vary according to the specific equipment used and the properties required in the resultant article of manufacture. In the preferred embodiment of the present invention, the process chamber is evacuated to the $10^{-7}$ Torr region before bake-out and deposition. Load-locking the system may, of course, be integrated into the system to reduce pump-down time. One concern with some substrate materials is the susceptibility of the substrate to etching by the $XeF_2$ vapor, prior to deposition. In the preferred embodiment, a shutter (7), in close proximity to the substrate surface, allows presputtering of the target material prior to deposition. For magnetron plasma sputtering, the plasma may be powered by various sources. For "metallic mode" sputtering, the sputtering plasma may be powered by D.C., low-frequency R.F., high-frequency R.F., or microwave power. If the target surface is allowed to form an insulating fluoride surface-layer, then D.C. power should be abandoned for an alternating current source (>40 kHz, typically). The shutter is situated to receive deposit from both the pre-sputtered metal vapor and the impinging $XeF_2$ vapor, protecting the substrate surface until the proper deposition conditions are achieved. In addition, the $XeF_2$ vapor is typically only admitted after pre-sputtering of the target has begun, so that no halide gas is present in the process volume without getter-sputtering mechanisms in progress. Negligible $XeF_2$ vapor is then allowed to impinge on the substrate surface prior to deposition.

The degree of etching of the substrate by fluorine will vary widely from one substrate material to another. The requirements of the interface between the substrate and the deposited fluoride will also vary widely, depending on the requirements of the resulting article of manufacture. Accordingly, the specific process requirements for forming the initial substrate-fluoride interface will also vary considerably. However, the previously discussed method of shuttering and getter-sputtering will suffice for most present-day applications. In some cases, it will be beneficial to deposit an initial diffusion barrier film, or seed layer, as is common in the prior art of thin film deposition.

While the preferred embodiment of the present invention is developed primarily for the reactive sputtering of Group I and Group II metal fluorides, such as MgF, CaF, LiF, the principles of the present invention may easily be applied in the formation of other fluorinated compounds. For example, thin films of yttrium fluoride may be deposited using the methods and apparatus of the previous discussion. In fact, the target may consist of any target material which allows the creation of a suitable sputtered vapor; such a suitable sputtered vapor being that which allows reaction with the $XeF_2$ vapor to produce a solid film. Similarly, other sputtering configurations other than that specified in the preferred embodiment might be utilized without departing from the principles and spirit of the present invention. For example, ion-beam sputter deposition is a method that has been known to provide high-quality films in a well-controlled manner. In this latter method, $XeF_2$ could be admitted so as to form a fluorinated surface on a metal target, which would subsequently be sputtered by an incident ion beam. As in the case of other sputtering configurations (magnetron plasma sputtering, diode plasma sputtering, laser sputtering, etc.), the $XeF_2$ may be allowed to react with the target material to various degrees. The advantages and disadvantages of allowing fluorination of the target surface will vary according to the process requirements. The formation of a fluoride layer at the target surface will typically be accompanied by a marked drop in the sputter yield of the target, a higher production of negative fluorine ions, and a change in the target self-bias voltage. One is thereby allowed to tailor such process variables as the deposition rate, the energy of the depositing species, and so forth.

It is not intended that the present invention be utilized for the formation of only single layers of fluorinated compounds. In fact, the principles and methods set forth in the preferred embodiment are well suited for depositing multiple layers of thin or thick films. This may be accomplished through various means, many of which are developed in the prior art. For example, alternating layers of two distinct fluorinated compounds may be consecutively deposited through utilization of two separate sputtering sources, either in the same chamber, or in separate chambers. Also, the present invention is not restricted to the deposition of contiguous films, as it also ideally suited for directional sputtering, ionized-PVD, and other such approaches which allow desirable coverage for vias, trenches, and other forms of surface relief.

Although the present invention has been described in detail with reference to the embodiments shown in the drawing, it is not intended that the invention be restricted to such embodiments. It will be apparent to one practiced in the art that various departures from the foregoing description and drawing may be made without departure from the scope or spirit of the invention.

What is claimed is:

1. A method of forming a film on a substrate, comprising:
    a. providing a vacuum chamber;
    b. providing a sputtering target material within the vacuum chamber;
    c. positioning the substrate within the vacuum chamber;
    d. introducing a $XeF_2$ vapor into the vacuum chamber, in the vicinity of the substrate;
    e. sputtering the target material, thereby creating a vapor of the target material; and
    f. forming a film on the substrate, the film being a compound containing both fluorine atoms and atoms of the target material.

2. The method of claim 1, wherein the target material is fluorinated prior to the sputtering step.

3. A method of forming a film on a substrate, comprising:
    a. providing a vacuum chamber;
    b. providing a sputtering target material within the vacuum chamber;
    c. positioning the substrate within the vacuum chamber;
    d. introducing a $XeF_2$ vapor into the vacuum chamber;
    e. sputtering the target material, thereby creating a vapor of the target material; and
    f. forming a film on the substrate, the film being a compound containing both fluorine atoms and atoms of the target material.

4. The method of claim 3, wherein the target material is fluorinated prior to the sputtering step.

* * * * *